(12) United States Patent
Jacobson et al.

(10) Patent No.: US 6,294,401 B1
(45) Date of Patent: Sep. 25, 2001

(54) NANOPARTICLE-BASED ELECTRICAL, CHEMICAL, AND MECHANICAL STRUCTURES AND METHODS OF MAKING SAME

(75) Inventors: Joseph M. Jacobson, Newton; Brian N. Hubert; Brent Ridley, both of Cambridge; Babak Nivi, Boston, all of MA (US); Sawyer Fuller, Los Osos, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/334,873

(22) Filed: Jun. 17, 1999

Related U.S. Application Data
(60) Provisional application No. 60/097,037, filed on Aug. 19, 1998.

(51) Int. Cl.[7] ................................................. H01L 51/40
(52) U.S. Cl. ................................................................ 438/99
(58) Field of Search ............................. 438/99, 100, 793, 438/794

(56) References Cited

U.S. PATENT DOCUMENTS

| | | | |
|---|---|---|---|
| 5,262,357 | 11/1993 | Alvisatos et al. | 437/233 |
| 5,470,910 | 11/1995 | Spanhel et al. | 524/785 |
| 5,559,057 | 9/1996 | Goldstein | 437/228 |
| 5,576,248 | 11/1996 | Goldstein | 437/225 |
| 5,711,803 | 1/1998 | Pehnt et al. | 117/4 |
| 5,751,018 * | 5/1998 | Alivisatos et al. | 257/64 |
| 5,892,230 * | 4/1999 | Goodberlet et al. | 250/361 R |

FOREIGN PATENT DOCUMENTS

| | | | |
|---|---|---|---|
| WO93/10564 | 5/1993 | (WO) | . |
| WO98/03896 | 1/1998 | (WO) | G02F/1/133 |

OTHER PUBLICATIONS

Kotov et al., "Layer–by–Layer Self–Assembly of Polyelectrolyte—Semiconductor Nanoparticle Composite Films," J. Phys. Chem., pp. 13065–13069, (1995).

Schlamp et al., "Improved efficiencies in light emitting diodes made with CdSe(CdS) core/shell type nanocrystals and a semiconducting polymer," J. Appl. Phys. 82 (11), pp. 5837–5842, (Dec. 1, 1997).

(List continued on next page.)

Primary Examiner—Charles Bowers
Assistant Examiner—William M. Brewster
(74) Attorney, Agent, or Firm—Testa, Hurwitz & Thibeault, LLP

(57) ABSTRACT

Nanoparticles are utilized to create, through deposition and patterning, functional electronic, electromechanical, and mechanical systems. At sizes ranging from 1 to 999 nm, the ratio of surface atoms to interior atoms becomes non-negligible, and particle properties therefore lie between those of the bulk and atomic materials. Monodisperse (i.e., uniformly sized) or polydisperse nanoparticles can form stable colloids or suspensions in appropriate dispersing media, facilitating their deposition and processing in a liquid state. As a result, printing technology can be utilized to deposit and pattern nanoparticles for mass production or for personal desktop manufacturing.

14 Claims, 7 Drawing Sheets

OTHER PUBLICATIONS

Schultz et al., "Spray Deposition of CdTe Thin Films Using Nanoparticle Precur–sors," Materials of Science Forum, vol. 225–227, pp. 169–174, (1996).

Greenham et al., "Charge separation and transport in conjugated poly–mer/cadmium selenide nanocrystal composited studied by photoluminescence quenching and photoconductivity," Synthetic Metals 84, pp. 545–546, (1997).

Cassagneau et al., "Layer–by–Layer Assembly of Thin Film Zener Diodes from Conducting Polymers and CdSe Nanoparticles," J. Am. Chem. Soc., 120, pp. 7848–7859, (1998).

Alivisatos, A.P., MRS Bulletin, p. 18 (Feb. 1998).

Markovich et al., Appl. Phys. Lett. 70:3107 (1997).

Heath et al., J. Phys. Chem. B 101:189 (1997).

Souteyrand et al., J. Phys. Chem. B 101:2980 (1997).

Klein et al., Nature 389:699 (1977).

Lee et al., Int'l. Display Res. Conf. p. 211 (1991).

Schulz et al., Mat. Res. Soc. Symp. Proc. 426:349, (1996).

Herron et al., Science 259:1426, (1993).

Goldstein, et al., Science 256:1425, (1992).

Jarvis, et al., Mat. Res. Soc. Symp. Proc. 272:229, (1982).

Newell et al., Science 270:1338, (1995).

Murray, et al., Science 270:1335, (1995).

Murray, et al., J. Am. Chem. Soc. 115:8706, (1993).

Brus, J. Phys. Chem. Solids 4: 459 (1998).

Siegel, Scientific American 275:74, (1996).

Xia et al., Angew. Chem. Int. Ed. 37:550 (1998).

* cited by examiner

NANOPARTICLE-BASED ELECTRICAL, CHEMICAL, AND MECHANICAL STRUCTURES AND METHODS OF MAKING SAME

PRIOR APPLICATION

This application stems from U.S. Ser. No. 60/097,037, filed on Aug. 19, 1998.

FIELD OF THE INVENTION

The present invention relates to fabrication of electronic, chemical, and mechanical devices by deposition techniques such as printing.

BACKGROUND OF THE INVENTION

Electronic and electromechanical components are presently fabricated in large, immobile manufacturing facilities that are tremendously expensive to build and operate. For example, semiconductor device fabrication generally requires specialized microlithography and chemical etching equipment, as well as extensive measures to avoid process contamination.

The large up-front investment required for manufacturing capacity not only limits its general availability, but also increases the cost of custom fabrication. For a small custom order to be financially competitive with mass production of an established device, the per-unit cost will necessarily be quite high—often out of reach for many designers. Currently, the economics of device fabrication disfavors sophistication and small batch sizes.

In addition to their expense, the fabrication processes ordinarily employed to create electronic and electromechanical components involve harsh conditions such as high temperatures and/or caustic chemicals, limiting the ability to integrate their manufacture with that of functionally related but environmentally sensitive elements. For example, the high temperatures used in silicon processing may prevent three-dimensional fabrication and large-area fabrication; these temperatures are also incompatible with heat-sensitive materials such as organic and biological molecules. High temperatures also preclude fabrication on substrates such as conventional flexible plastics, which offer widespread availability and low cost.

These fabrication processes are also subtractive, depositing a desired material over an entire substrate before removing it from undesired locations through techniques such as etching and lift-off. Subtractive processes are wasteful; introduce dangerous, costly, and environmentally unfriendly chemicals to the fabrication process; and limit the range of manufacturable devices since the etch chemistry can interact with previously deposited layers.

Approaches toward reducing the cost of custom manufacture are described in copending application Ser. No. 08/958,098 and published PCT Application WO 98/03896. In accordance with these publications, semiconductor devices are fabricated by successive deposition of electrically active layers in a manner analogous to conventional printing. The described processes facilitate manufacture outside of vacuum, in an artibrary pattern and on a wide range of substrates, without the need for specialized techniques such as chemical etching. They are also additive, confining material deposition to appropriate areas.

These processes, while highly advantageous in some applications, are nonetheless limited in terms of the properties achievable by the resulting devices. In particular, devices based on electrically active particles dispersed in an inert binder tend to be limited in terms of clock speed owing to the permanent spacing between particles. While it is possible to increase clock speed by fusing the particles into a continuous layer, this requires high-temperature processing which is costly and, as noted above, may damage the substrate or other electrically active layers.

DESCRIPTION OF THE INVENTION

Brief Summary of the Invention

The present invention overcomes the limitations of the prior art through the innovative use of nanoparticles to create, through deposition and patterning, functional electronic, electromechanical, chemical, and mechanical systems. The invention exploits the fact that many physical, electrical, and optical properties that appear constant in the bulk of organic and inorganic materials are size-dependent at the very small scales characteristic of nanoparticles. At these sizes—ranging from nearly 1 to 999 nm—the ratio of surface atoms to interior atoms becomes nonnegligible, and particle properties therefore lie between those of the bulk and atomic materials. Monodisperse (i.e., uniformly sized) or polydisperse nanoparticles can form stable colloids in appropriate dispersing media, facilitating their deposition and processing in a liquid state. As a result, additive printing technology can be utilized to deposit and pattern nanoparticles for mass production or for personal desktop manufacturing.

Furthermore, a key property that changes at small sizes is melting point. The effect is substantial; in some semiconductors, melting points have been observed to drop more than 1000° C. from the bulk material. The melting point depression observed in nanoparticle systems faciliates the low-temperature sintering, annealing, and melting of nanoparticles into crystalline films. As a result, nanoparticles can be printed and heated at low temperatures to form films of the bulk material, or can instead be printed and left in dispersed form to retain the size-dependent properties characteristic of the nanoparticles.

Unlike conventional electrically active particles, nanoparticles are formed not by grinding, but instead via chemical methods (such as pyrolysis) or physical methods (such as physical vapor synthesis). Nanoparticles useful in accordance with the present invention may be pristine or surrounded by a "capping" group to passivate the surface, alter surface chemistry, facilitate dispersion in a liquid, or modify some other aspect of the particle's morphology or behavior. Following their deposition, nanoparticles can self-assemble to form highly ordered thin films and superlattices that may exhibit multiple phases.

Accordingly, in a preferred embodiment, the invention comprises a method of fabricating an active component comprised of portions consisting of different materials, at least one of the starting materials being in the form of nanoparticles dispersed in a carrier. The nanoparticles differ from a bulk material of identical composition in at least one physical property, thereby conferring a desired functionality or processing advantage. In accordance with the method, the materials are deposited onto a substrate in a succession of layers which, in sum, define a selected electrical, mechanical, chemical, and/or electromechanical activity of the component. The nanoparticles within each deposited layer are immobilized (by fusing, melting, or annealing the particles into a continuous material, by curing the carrier into a permanent matrix, by surrounding the nanoparticles with bifunctional surface groups that link adjacent nanoparticles, or merely by evaporating the carrier using heat or low pressure) in order to facilitate performance of the intended function. Also within the scope of the invention are components fabricated in accordance with the methods hereof.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

1. Nanoparticle Synthesis and Suspension

Figure 1:
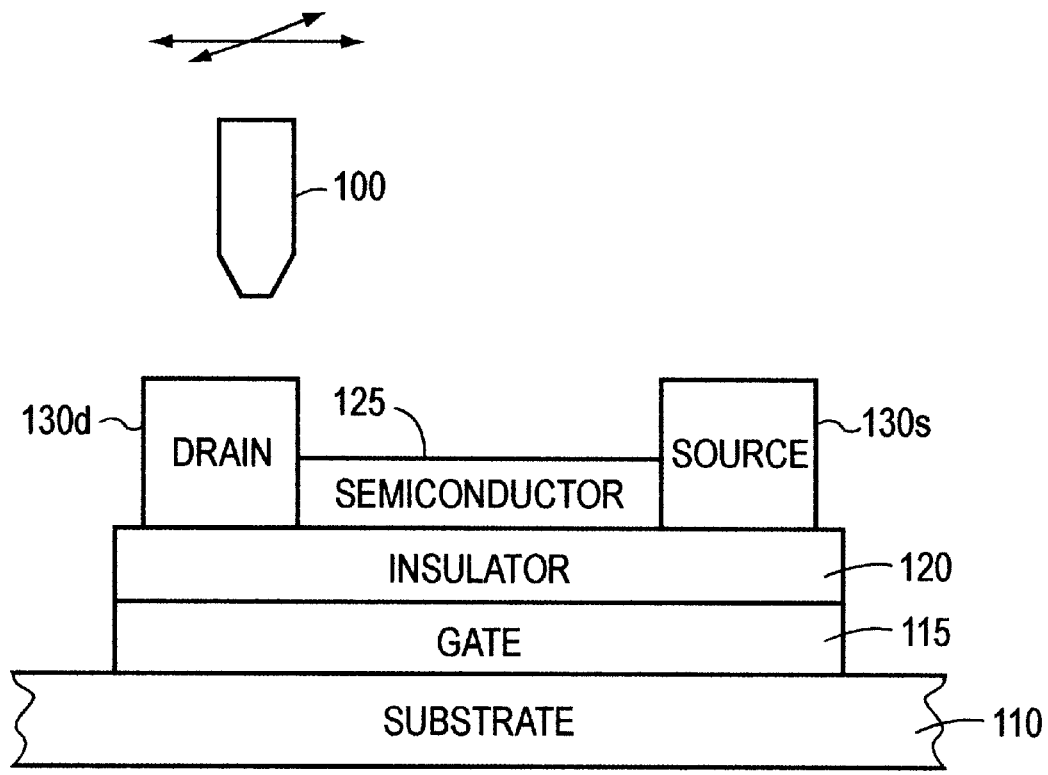
FIG. 1 is a greatly enlarged side elevation of a thin-film transistor device, showing its mode of fabrication in accordance with the present invention.

Particles useful in accordance with the present may be monodisperse or polydisperse, and may represent a homogeneous suspension of a single species of nanoparticle or a heterogeneous suspension of different nanoparticles. Representative classes of nanoparticle include insulators (e.g., silicon dioxide); semiconductors (e.g., silicon or cadmium selenide); and conductors (e.g., silver).

Numerous synthetic approaches, including pyrolysis of organometallic precursors, arrested precipitation, precipitation in reverse micelles, and exchange (metathesis) reactions, have been used to generate nanoparticles. In principle, virtually any nanoparticle synthesis is appropriate for the production of nanoparticles for the purposes of the present invention. However, because nanoparticle properties depend strongly on size, shape, crystallinity, and surface derivatization, in practice the particle synthesis is tailored so as to control these parameters for a particular application. In general, if the nanoparticles are not intended for bulk thick or thin film deposition—i.e., they will be applied and utilized in their native particulate state without subsequent fusion into the bulk material—then any synthesis yielding appropriate size control and crystallinity can be utilized.

On the other hand, if the particles are printed as a precursor to bulk thick or thin films, the synthesis should yield particles without tightly bound or heavy capping groups. Capping groups (sometimes used during synthesis to retard particle growth) can be problematic in bulk film applications if they become trapped as impurities or impede crystal growth, thereby compromising film quality. Pyrolytic syntheses using pyridines and other coordinating solvents (see, e.g., Murray et al., *J. Am. Chem. Soc.* 115:8706 (1993)), micelle-based approaches (see, e.g., Steigerwald et al., *J. Am. Chem. Soc.* 110:3046 (1988)), and some metathetic preparations (see, e.g., Jarvis et al., *Mat. Res. Soc. Symp. Proc.* 272:229 (1992)) can all yield particles free of heavy organic capping groups.

In synthesizing Group II–VI semiconductor nanoparticles, in particular CdSe, we have further developed the metathesis synthesis to form very small particles without the use of heavy capping groups. Such small sizes are desirable for their low melting point, as discussed in further detail below. In an oxygen- and water-free environment such as a nitrogen atmosphere maintained in a glove box, equimolar amounts of methanol-based solutions of $CdI_2$ and $Na_2Se$ are combined in a solvent, such as pyridine, that both interacts with the particles and retards their growth. The particles immediately begin to reversibly flocculate and fall from solution, forming CdSe according to the equation

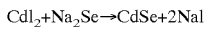

After filtering or decanting, the particles are washed with methanol to remove the soluble byproduct, NaI, and the particles are then dispersed in pyridine. In principle, other coordinating solvents such as amines, pyridines, and furans will work as well. In pyridine, it is found that the particles ripen and the size distribution narrows as the particles form the most thermodynamically stable size species. For CdSe in pyridine, these species are all below 2 nm in diameter. At such a small size the particles are believed to be analagous in size and shape to tetrahedral clusters reported in Herron et al., *Science* 259:1426 (1993). Because of the molecular character and closed structural shell, particles with this structure are strongly favored thermodynamically, thus controlling size and keeping the particles below 2 nm in diameter.

By choosing appropriate reagents and a coordinating solvent, it should be possible to generalize this approach to form a number of weakly capped nanoparticle species at sizes appropriate for low-temperature thermal processing into bulk crystalline films. For the CdSe particles described, the volatile solvent pyridine acts as the capping group. The critical feature of this synthesis is the coordinating solvent. It can function as both a reaction solvent to which the reagents are added, or as a component of a reagent solution. Either method of introducing the pyridine works well for limiting particle growth to sizes below 2 nm, and pyridine is readily removed from the nanoparticle surface upon heating.

Nanoparticles may be passivated at the surface by an organic capping group, which surrounds the typically inorganic particle core as a shell. In such circumstances, it is the capping group that largely determines the solubility of the particles, and thus what solvents are appropriate for carrying the particles. Additionally, the capping groups can act as a critical component in a device. For example, the caps can act as electrical insulators or sensitizers. An alkylthiol (such as 1, 10-decanedithiol) is useful as an insulator and also to cross-link adjacent particles, while semiconductor nanoparticles can be surrounded by a semiconductor polymer of different electron affinity, which thereby serves as a sensitizer. For example, photovoltaic devices have been formed by capping CdSe nanoparticles with poly(2-methoxy,5-(2'-ethyl-hexyloxy)-p-phenylenevinylene) (see Alivisatos, *MRS Bulletin*, Febuary 1998, at 18). If desired, the capping group may be removed following deposition by application of heat and/or vacuum.

Inorganic materials such as ZnS can also cap particles. These may exhibit better adhesion to inorganic nanoparticles than organic molecules, and may improve properties such as luminescence. An inorganic shell also offers a way of introducing mixed materials into devices via a single type of particle, e.g., CdSe and CdS in a CdSe/CdS core/shell semiconductor nanoparticle (synthesis of which is described in Peng et al., *J. Am. Chem. Soc.* 119:7019 (1997)). More typically, however, an organic cap will be applied to the inorganic particle in order to confer a property of interest. Inorganic shells are formed during synthesis by simply growing an outer layer of the shell material on the particle. This may be accomplished by introducing the shell reagents to the core nanoparticle suspension under appropriate reaction conditions.

Nanoparticles are known to self-assemble into ordered arrays and superlattices, both with and without capping groups. If such ordered films orient not only particles but also their crystal planes, then long-range crystal order may be expected upon sintering, annealing, or melting. Highly faceted particles may be more likely to align their crystal planes than unfaceted particles. Self-assembly also offers the posibility of printing multiple phases or layers in a single pass, or for printing some pre-assembled structures or structures that assemble during the printing. Thus, different layers or regions might form as a result of a single printing step. Layers may form by size affinity, with large and small particles tending to group with other particles of similar size. See, e.g., Heath et al., *J. Phys. Chem. B* 101:189 (1997) and Dabbousi et al., *Chem. of Mat'ls.* 6:216 (1994), showing size-based particle clustering. Three-dimensional structures have been observed to occur when particles of different sizes are brought together and small particles cluster around single large ones.

2. Device Fabrication

Nanoparticles suspended in a liquid can be deposited and patterned onto a substrate using any of a wide variety of processes, including ink jetting, spincoating, casting, lithography, gravure printing, screen printing, impact printing, stamping, contact printing (whereby a liquid or solid pattern is transferred from a plate, stamp or cylinder), or transfer onto the substrate through a mask. Moreover, nanoparticles may be applied in the dry state by dry jetting, laser printing or electrophotography (whereby a substrate receives a charge pattern and the particles are drawn to the charged regions). Deposition or application may generally occur in an uncontrolled atmospheric environment, but a controlled atmosphere generally provides better process control. The deposited layers may serve as conductive, semiconductive, or insulating layers, chemically active layers, or as etch resists, light barriers, diffusion barriers, passivation layers, adhesion layers, encapsulants, or structural supports.

A representative application of the present invention is fabrication of thin-film transistors (TFTs). TFTs have heretofore been formed from, for example, CdSe by evaporation or sputtering. An attractive feature of CdSe is that in the bulk it can be annealed at a relatively low temperature (1–4 hours at 350° C.) in a dry air or nitrogen atmosphere. Annealing of the bulk film improves device performance by reducing defects as well as the number of donors, which tend to result from Se vacancies in the deposited film.

A CdSe TFT may be fabricated in accordance with the present invention as shown in FIG. 1. One or more deposition devices 100, movable in two (or three) dimensions, is scanned over a substrate and selectively activated to apply onto a substrate 110 a series of layers that collectively define the TFT. In particular, the TFT comprises a conductive gate layer 115, an insulator layer 120, a semiconductor layer 125, and source and drain conducting elements 130s, 130d. In the absence of an electrical gate 115, the structure in FIG. 1 can act as a light-sensitive photo-transistor. Deposition device 100 may be an ink-jet system configured to deliver a selected one of a series of solutions, colloids, and/or dispersions of one or more materials (as described, e.g., in the '098 application mentioned above, the entire disclosure of which is hereby incorporated by reference), or may instead be an ink-jet system utilizing multiple jet heads, each ejecting a single material.

Thus, a nanoparticle silver, chromium, gold, copper, aluminum or other metallic dispersion may be used to form gate 115 by deposition onto substrate 110. To form layer 120, a nanoparticle dispersion of silicon dioxide or barium titanate is deposited onto layer 115. The nanoparticle metal used for layer 115 may again be utilized to form source and drain elements 130s, 130d by deposition onto layer 120. And a CdSe (or other semiconductors, such as CdS, CdTe, or Si) nanoparticle dispersion is used to form layer 125, also by deposition onto layer 120. These materials may be left as deposited, or may instead be sintered, annealed, or melted to form layers with electronic properties approaching those of the bulk material. Annealing, for example, can take place during printing, after each printing step, or following deposition. As with any bulk film, annealing can consist of multiple stages of treatment at different temperatures (e.g., temperature ramp-up and/or thermal shock), heating mechanisms, durations, or ambients to improve selected electrical and/or mechanical properties. To anneal the particles, the temperature of the environment is elevated to a point high enough to remove the capping groups (if any) and to cause fusion, annealing, or melting of particles in all layers for which a bulk film is desired. Alternatively, electromagnetic radiation, such as from a heat lamp or laser, may be used to thermally convert the nanoparticles to their bulk state.

Figure 2:
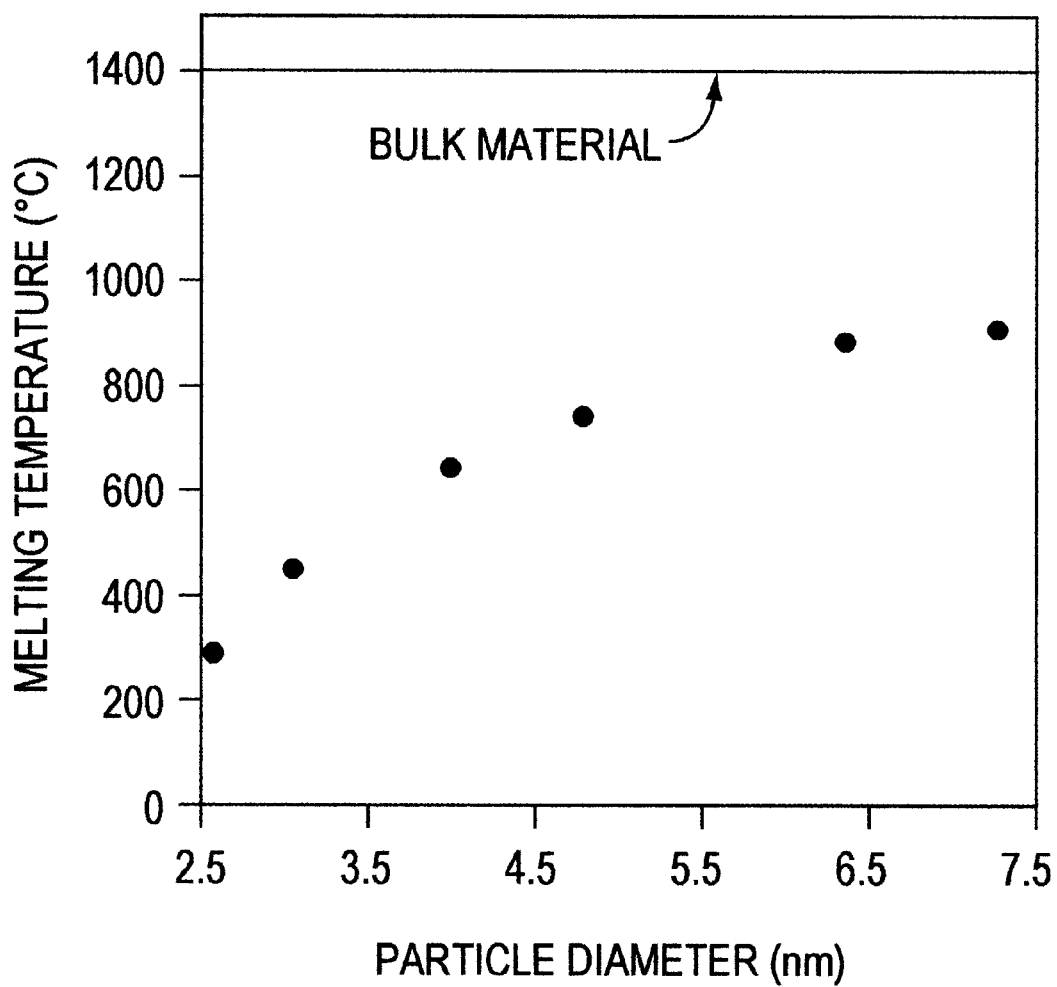
FIG. 2 graphically illustrates the melting temperature vs. particle size of CdS nanoparticles.

The melting temperature of nanoparticles is highly dependent on particle size, and is desirably well below that of the bulk material. The melting behavior of CdS as a function of particle diameter is illustrated, for a representative size range, in FIG. 2. All nanoparticles within the illustrated size range have melting points well below that of the bulk material. For particles below 2.5 nm in diameter, temperatures as low as 250° C. are adequate.

Figure 3:
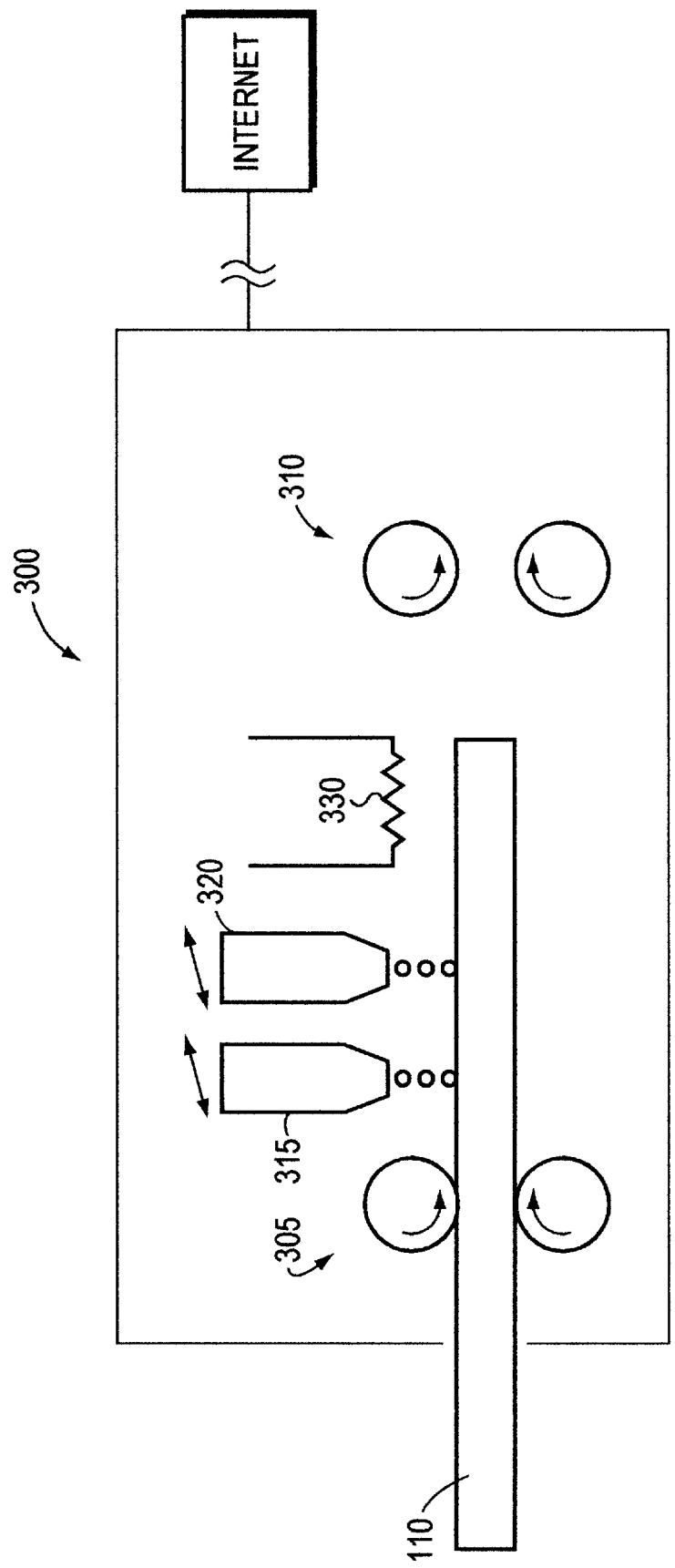
FIG. 3 schematically illustrates an embodiment of the invention configured as a printer.

With reference to FIG. 3, an alternative fabrication embodiment is configured as a printer 300 and includes rollers representatively indicated at 305, 310 for conducting the substrate 110 through a printing path. A series of deposition (e.g, ink-jet) heads representatively indicated at 315, 320 apply different nanoparticle-containing liquids onto appropriate portions of substrate 110 as it passes beneath them. Because substrate 110 is in motion along one dimension, heads 315, 320 need only translate along the orthogonal dimension to effect a complete scan of the substrate surface. A heating element 330, which emits heat or electromagnetic radiation, sinters, melts, cures or anneals the deposited material. (Alternatively, the substrate may be heated during during deposition—e.g., by hot stamping—to cause annealing.) The printer 300 may be connected to an external source of data, such as the Internet, which encodes the desired device and thereby determines the pattern and materials that will be applied to substrate 110 by heads 315, 320. As a result, electronic hardware may be purchased over the Internet; the printer's owner downloads the appropriate file, which is executed on printer 300 to facilitate near instantaneous delivery of the purchased equipment.

Without heating, the nanoparticles retain their size-dependent properties, and in a transistor structure an unannealed nanoparticle semiconductor can form a single-electron transistor.

Figure 4:
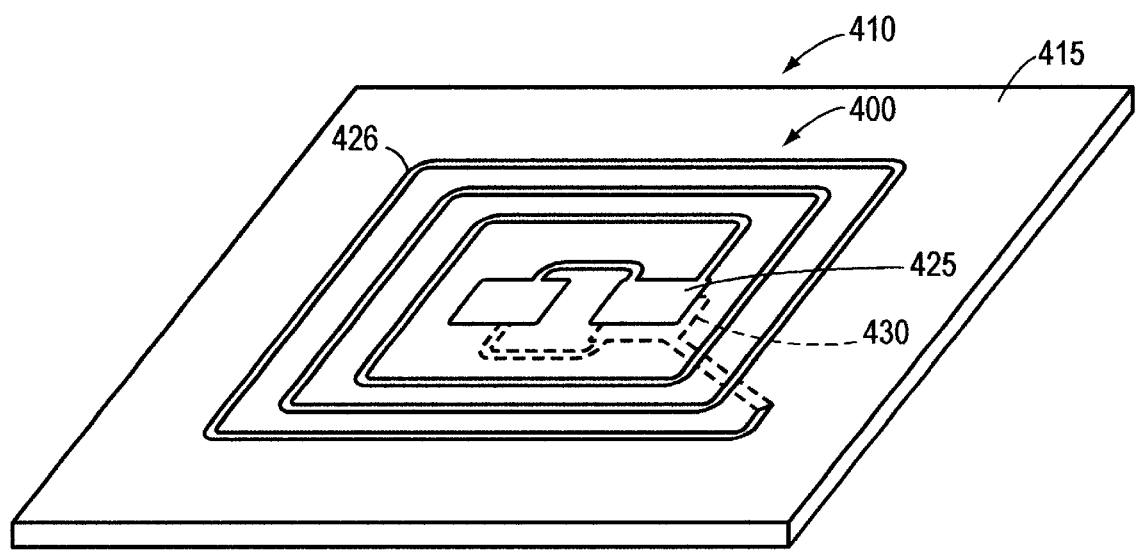
FIG. 4 illustrates an electronic identification tag fabricated entirely by printing in accordance with the present invention.

The transistor illustrated in FIG. 1 may be connected to other printed or non-printed components to form functional electronic circuits. The means of connection may, for example, be established by deposition of nanoparticle conductors and, if necessary, insulators. These circuits may be connected to other printed or non-printed electronic, mechanical, chemical, or electromechanical devices. For example, with reference to FIG. 4, an electronic identification tag 400 is fabricated on a dielectric substrate 410 entirely by printing. Nanoparticle conductors are printed onto a surface 415 of substrate 410, forming a spiral structure 420 that behaves as an inductor. The inner terminus 425 of spiral structure 420 is configured as a pad that acts as one plate of a capacitor. The outer terminus of spiral structure 420 penetrates the substrate 410 and connects to a second pad 430 directly underlying pad 425. Pads 425, 430 together form a capacitor, and are connected to a logic module 440. Module 440 comprises a series of thin film transistors that are also applied by printing (each conforming, for example, to the device shown in FIG. 1) and are interconnected to perform arbitrary logic functions. When the device 400 is excited by the magnetic field created by an external coil, preferably at the resonance frequency established by the capacitor and inductor, the logic module 440 modulates the device's response so as to convey a series of bits—i.e., the device's signature—in the time domain to the external coil. This allows electronics connected to the external coil to read the device's signature.

Figure 5:
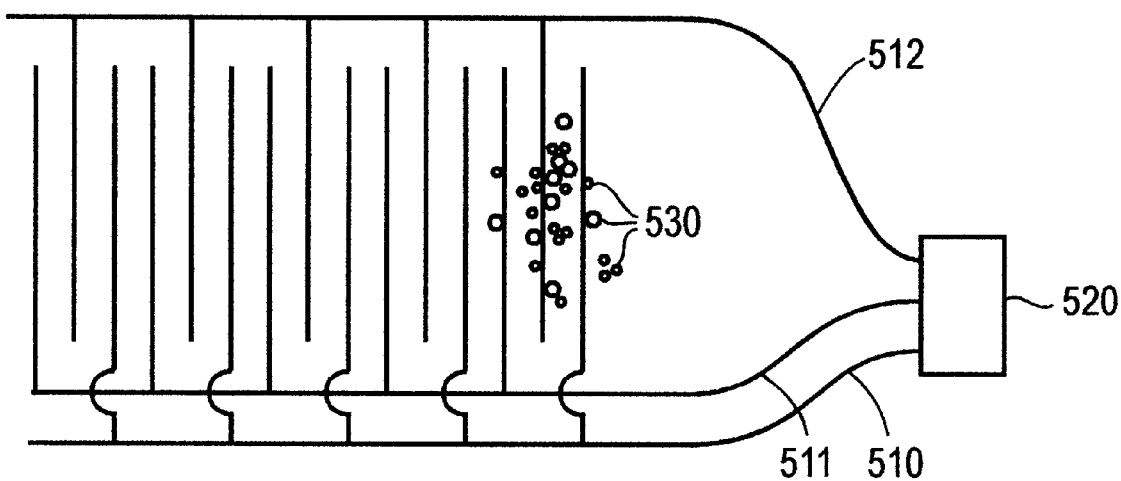
FIG. 5 schematically depicts a three-phase linear motor realized in accordance with the present invention.

Nanoparticle layers may also be used for their structural qualities in the fabrication of mechanical and electromechanical devices. Such devices include, for example, the linear and rotary actuators described in the '098 application, as well as devices such as the three-phase linear motor illustrated in FIG. 5 and the conductive cantilever structure illustrated in FIG. 6. With reference to FIG. 5, a three-phase linear drive motor 500 consists of three patterned electrical conductors 510, 511, and 512 driven by a logic module 520. Conductors 510, 511, and 512 are fabricated and patterned using nanoparticle colloids applied to a substrate (e.g., plastic) as described above. Logic module 520 comprises a collection of thin film transistors interconnected so as to drive conductors 510, 511, and 512 with a three-phase voltage source (not shown). This three-phase voltage causes the motion of polarizable (high dielectric constant, low dielectric loss) particles 530 that are placed on the surface of conductors 510, 511, and 512.

Figure 6A:
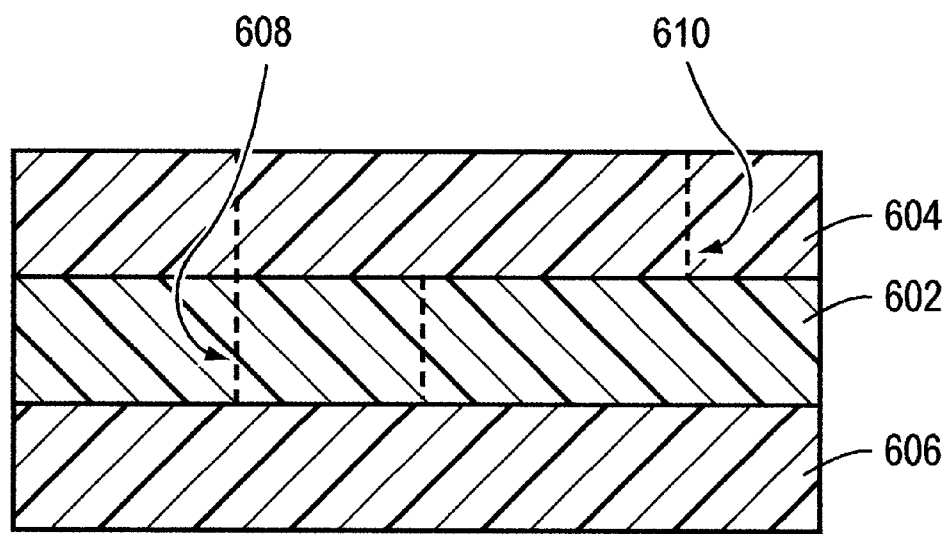
FIGS. 6A and B illustrate a microelectromechanical cantilever fabricated in accordance with the present invention.
Figure 6B:
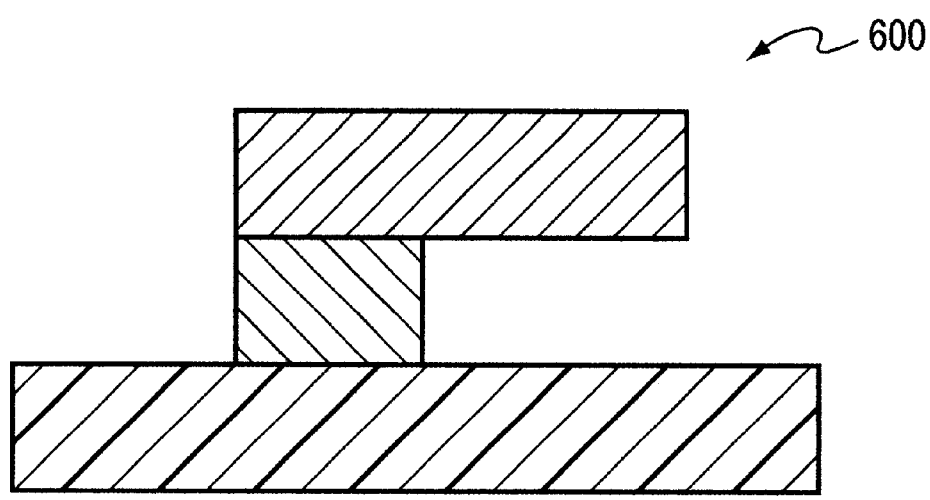

FIGS. 6A and 6B illustrate construction of a conductive cantilever 600 using the approach of the present invention. With reference to FIG. 6A, first and second nanoparticle layers 602, 604 are sequentially deposited onto a suitable (e.g., plastic) substrate 606. A pair of regions 608, 610 within the nanoparticle layers 602, 604 are selectively converted to conductive bulk material with improved structural properties by application of heat from a laser beam or resistively heated AFM (atomic force microscope) tip. The cantilever 600 is revealed by a release etching step, which removes the unconverted nanopaticle material.

Nanoparticle layers may also be used for their chemical functionality (i.e., their intrinsic chemical properties or those of the capping group). Such functionality can serve as an adhesion layer or etch resist, or as a site for chemical modification and detection. As an example, transistor structures similar to those described in FIG. 1 can be modified such that the conductive gate is replaced with a chemically sensitive material, such as single-stranded oligonucleotides (see Souteyrand et al., *J. Phys. Chem. B* 101:2980 (1997)), thereby forming a so-called "chemFET" device. This modification is acheived by specific chemical interaction with the surface of the nanoparticle or nanoparticle-derived film.

Figure 7:
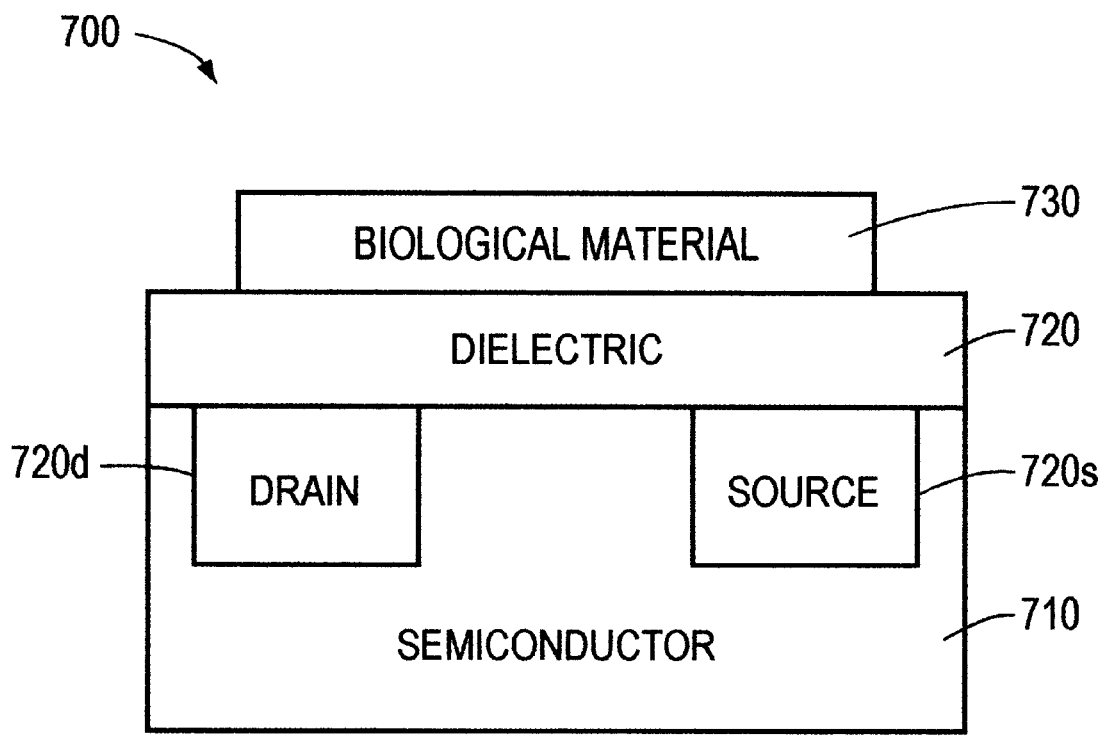
FIG. 7 illustrates a chemFET fabricated in accordance with the present invention.

As shown in FIG. 7, a chemFET 700 comprises a semiconductor layer 710, source and drain elements 720d, 720s, and a dielectric layer 725 applied thereover. Tailoring the surface of the dielectric layer 725 facilitates the detection of specific chemicals and/or biological materials 730 disposed on layer 725 through interaction therewith. The ionic charge of such chemicals places an electric field across the device, and, similar to the electronic gate in the transistor structure of FIG. 1, modifies the conducting properties of the semiconductor channel. In the case of oligonucleotides, the hybridization of the oligonucleotide can be detected. For example, layer 725 may be an insulator film fabricated by sintering a deposited nanoparticle colloid and subsequently treating the material to expose reactive hydroxyl groups that bind with the chemical or biological material. Alternatively, a dielectric layer can consist of unsintered nanoparticles. These will act as an insulator due to retention of the capping group, which thereby provides sites for chemical modification (so that the biological material reacts with the cap, or a material subsequently bound to the cap, rather than with the inorganic nanoparticle material).

Although the present invention has been described with reference to specific details, it is not intended that such details should be regarded as limitations upon the scope of the invention, except as and to the extent that they are included in the accompanying claims.

What is claimed is:

1. A method of fabricating an active component comprised of portions consisting of different materials, at least one of the materials being in the form of nanoparticles dispersed in a carrier, the nanoparticles (i) comprising an inorganic core surrounded by organic capping groups, (ii) having a submicron size, and (iii) differing from a bulk material of identical composition in at least one physical property, the method comprising the steps of:

a. applying the materials onto a substrate in a succession of layers which, in sum, define a selected activity of the component, the activity including at least one of electrical activity, mechanical activity, chemical activity, electromechanical activity, electromagnetic activity and optical activity, each layer representing a portion of the component;

b. immobilizing the nanoparticles to form at least one uniform layer thereof; and c. removing the organic capping group.

2. The method of claim 1 wherein the organic capping group is removed by the application of at least one of heat and vacuum.

3. The method of claim 1 wherein at least one layer comprises nanoparticles of at least one semiconductor.

4. A method of fabricating an active component comprised of portions consisting of different materials, at least one of the materials being in the form of nanoparticles dispersed in a carrier, the nanoparticles having a submicron size and differing from a bulk material of identical composition in at least one physical property, the method comprising the steps of:

a. applying the materials onto a substrate in a succession of layers which, in sum, define a selected activity of the component, the activity including at least one of electrical activity, mechanical activity, chemical activity, electromechanical activity, electromagnetic activity and optical activity, each layer representing a portion of the component; and b. immobilizing the nanoparticles to form at least one uniform layer thereof, wherein the deposited materials include at least one layer of semiconductive nanoparticles, at least one layer of conductive nanoparticles, and at least one layer of insulating nanoparticles.

5. The method of claim 4 further comprising the step of causing the nanoparticles to form continuous, discrete layers.

6. The method of claim 5 wherein the layers are formed by at least one of sintering, melting, and annealing.

7. The method of claim 1 wherein at least some of the layers are applied in a liquid state by a deposition process.

8. The method of claim 7 wherein the deposition process is selected from the group consisting of ink jetting, spin-coating, casting, lithography, gravure printing, screen printing, impact printing, stamping, roll-to-roll printing, and contact printing.

9. A method of fabricating an active component comprised of portions consisting of different materials, at least one of the materials being in the form of nanoparticles dispersed in a carrier, the nanoparticles having a submicron size and differing from a bulk material of identical composition in at least one physical property, the method comprising the steps of:

a. applying the materials onto a substrate in a succession of layers which, in sum, define a selected activity of the component, the activity including at least one of electrical activity, mechanical activity, chemical activity, electromechanical activity, electromagnetic activity and optical activity, each layer representing a portion of the component; and b. immobilizing the nanoparticles to form at least one uniform layer thereof, wherein at least one of the layers is applied in a dry state.

10. The method of claim 9 wherein said layers are applied by at least one process selected from the group consisting of dry jetting, laser printing or electrophotography.

11. The method of claim 3 wherein the semiconductor comprises CdSe.

12. The method of claim 1 further comprising the steps of:

a. receiving, from a remote site, data specifying the active component in terms of the different materials and their placement; and b. locally performing the applying step in accordance with the data.

13. The method of claim 11 wherein the data is received via a computer network.

14. A component fabricated in accordance with claim 1.

* * * * *